US012615763B2

(12) United States Patent
Huang

(10) Patent No.: US 12,615,763 B2
(45) Date of Patent: Apr. 28, 2026

(54) SEMICONDUCTOR DEVICE STRUCTURE WITH AIR GAP AND METHOD FOR PREPARING THE SAME

(71) Applicant: NANYA TECHNOLOGY CORPORATION, New Taipei City (TW)

(72) Inventor: Chih-Wei Huang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 314 days.

(21) Appl. No.: 18/241,057

(22) Filed: Aug. 31, 2023

(65) Prior Publication Data

US 2025/0081438 A1      Mar. 6, 2025

(51) Int. Cl.
| | |
|---|---|
| *H10B 12/00* | (2023.01) |
| *H10D 30/01* | (2025.01) |
| *H10D 30/62* | (2025.01) |
| *H10D 62/13* | (2025.01) |

(52) U.S. Cl.
CPC ........... *H10B 12/36* (2023.02); *H10B 12/056* (2023.02); *H10B 12/485* (2023.02); *H10B 12/488* (2023.02); *H10D 30/024* (2025.01); *H10D 30/6211* (2025.01); *H10D 62/151* (2025.01)

(58) Field of Classification Search
CPC .... H10B 12/36; H10B 12/056; H10B 12/485; H10B 12/488; H10B 12/482; H10B 12/09; H10D 30/024; H10D 30/6211; H10D 62/151
See application file for complete search history.

(56) References Cited

U.S. PATENT DOCUMENTS

| | | | |
|---|---|---|---|
| 11,233,134 B2 * | 1/2022 | Chu .................. | H10D 30/0212 |
| 12,136,570 B2 * | 11/2024 | Khaderbad ............ | H10D 30/62 |
| 2011/0079836 A1 | 4/2011 | Lin | |
| 2016/0293749 A1 * | 10/2016 | Park ..................... | H10D 62/115 |
| 2017/0148797 A1 * | 5/2017 | Kim ...................... | H10B 10/12 |
| 2018/0254188 A1 * | 9/2018 | Kim .................. | H10D 64/0112 |
| 2021/0082707 A1 * | 3/2021 | Fan ................... | H10D 30/0212 |
| 2021/0118887 A1 * | 4/2021 | Kuo ..................... | H10B 12/37 |
| 2021/0134796 A1 * | 5/2021 | Kim .................. | H10D 30/6211 |

(Continued)

FOREIGN PATENT DOCUMENTS

| | | |
|---|---|---|
| CN | 112670286 A | 4/2021 |
| CN | 112750909 A | 5/2021 |

(Continued)

OTHER PUBLICATIONS

Office Action and and the search report mailed on Jun. 26, 2024 related to Taiwanese Application No. 112138581.

(Continued)

*Primary Examiner* — Victor A Mandala
(74) *Attorney, Agent, or Firm* — Xuan Zhang

(57) ABSTRACT

A semiconductor device structure includes a semiconductor substrate, a first fin structure, a first S/D structure, and a bit line contact. The first fin structure is protruding from the semiconductor substrate, and have a first sidewall, a second sidewall, and a top surface connecting the first sidewall to the second sidewall. The first S/D structure is disposed over the first fin structure, and covering the top surface, a portion of the first sidewall, and a portion of the second sidewall of the first fin structure. The bit line contact is disposed over the first S/D structure. The bit line contact includes a barrier layer in contact with the first S/D structure and a conductive layer disposed over the barrier layer.

12 Claims, 13 Drawing Sheets

(56) References Cited

U.S. PATENT DOCUMENTS

| 2022/0037331 A1* | 2/2022 | Kuo | ........................ H10B 12/37 |
| 2022/0115506 A1* | 4/2022 | Lee | ........................ H10D 30/43 |
| 2022/0278002 A1* | 9/2022 | Huang | ................. H10D 84/017 |
| 2022/0285221 A1* | 9/2022 | Khaderbad | ............ H10D 30/62 |
| 2022/0285515 A1* | 9/2022 | Khaderbad | ........ H10D 30/6735 |
| 2023/0063786 A1* | 3/2023 | Liao | .................... H10W 20/023 |
| 2023/0155005 A1* | 5/2023 | Huang | .............. H10D 84/0193 |
| | | | 257/288 |
| 2024/0105773 A1* | 3/2024 | Yu | ....................... H10D 30/6735 |
| 2024/0120203 A1* | 4/2024 | Hsiung | ............ H10D 64/01326 |
| 2024/0162323 A1* | 5/2024 | Shin | ..................... H10D 62/121 |
| 2024/0170546 A1* | 5/2024 | Choi | ................. H10D 30/6219 |
| 2025/0081439 A1* | 3/2025 | Huang | ................... H10B 12/36 |

FOREIGN PATENT DOCUMENTS

| CN | 113497041 A | 10/2021 |
| CN | 115842039 A | 3/2023 |
| TW | 202117939 A | 5/2021 |
| TW | 202125593 A | 7/2021 |
| TW | 202236524 A | 9/2022 |

OTHER PUBLICATIONS

Office Action and and the search report mailed on Mar. 12, 2024 related to Taiwanese Application No. 112138581.

Office Action and and the search report mailed on Sep. 3, 2025 related to Chinese Application No. 202410485136.X.

Summary translation of Office Action and and the search report mailed on Sep. 3, 2025 related to Chinese Application No. 202410485136.X.

Office Action and and the search report mailed on May 13, 2025 related to Taiwanese Application No. 113112835.

Summary translation of Office Action and and the search report mailed on May 13, 2025 related to Taiwanese Application No. 113112835.

Office Action and and the search report mailed on Oct. 29, 2024 related to Taiwanese Application No. 112138581.

* cited by examiner

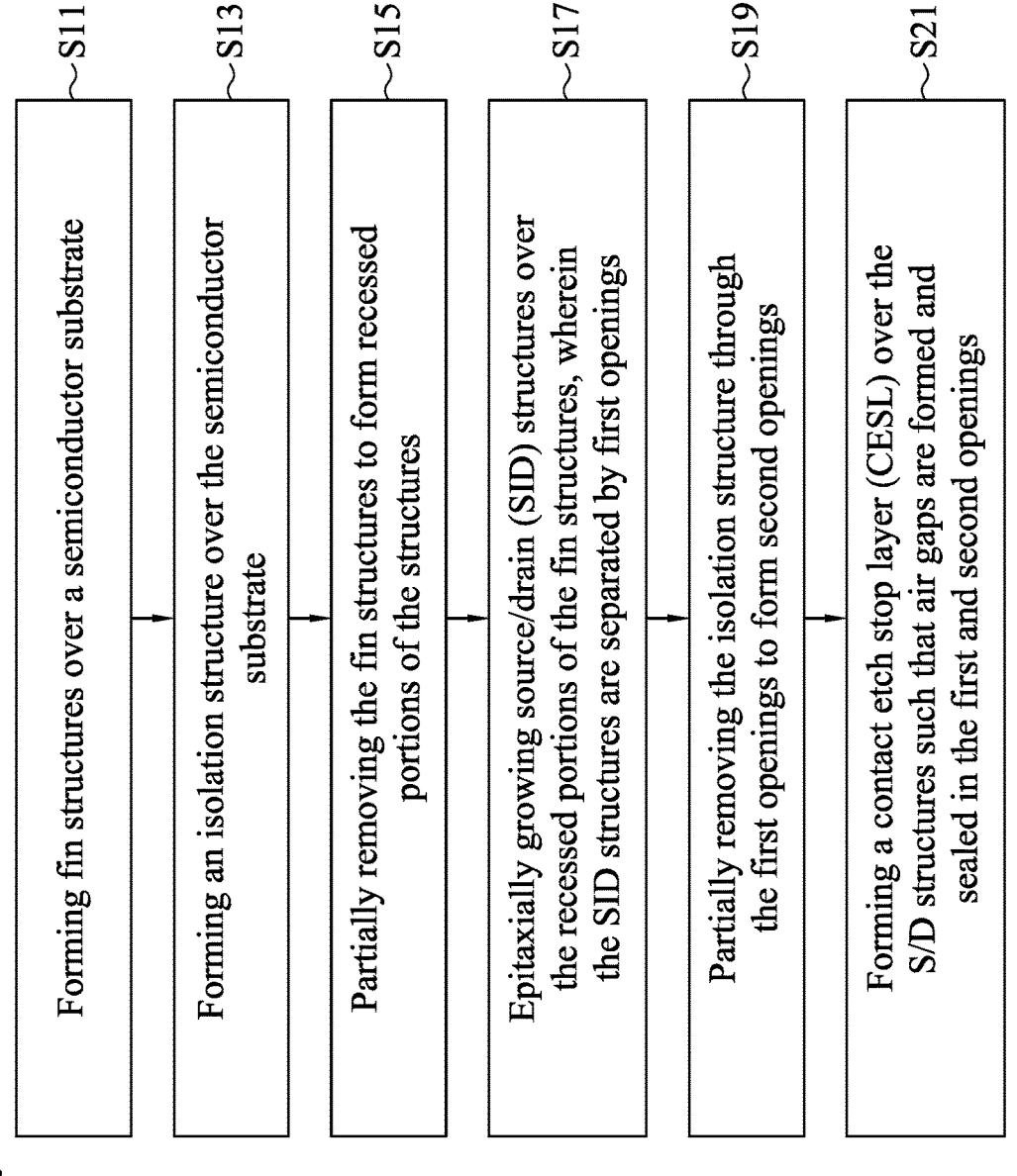

10

S11 Forming fin structures over a semiconductor substrate

S13 Forming an isolation structure over the semiconductor substrate

S15 Partially removing the fin structures to form recessed portions of the structures S17 Epitaxially growing source/drain (SID) structures over the recessed portions of the fin structures, wherein the SID structures are separated by first openings S19 Partially removing the isolation structure through the first openings to form second openings S21 Forming a contact etch stop layer (CESL) over the S/D structures such that air gaps are formed and sealed in the first and second openings

FIG. 3

SEMICONDUCTOR DEVICE STRUCTURE WITH AIR GAP AND METHOD FOR PREPARING THE SAME

TECHNICAL FIELD

The present disclosure relates to a semiconductor device structure and a method for preparing a semiconductor device structure, and more particularly, to a semiconductor device structure and a method for preparing a semiconductor device structure with an air gap between adjacent source/drain (S/D) structures.

DISCUSSION OF THE BACKGROUND

Due to their structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have been continuously reduced, causing the packing densities of such DRAMs to increase considerably. However, as DRAM memory cell dimension requirements dictate decreasing sizes, capacitive coupling is becoming an increasingly important issue that results in increased parasitic capacitance. Accordingly, the speeds of DRAM memory cells are undesirably reduced, and the overall device performance is therefore negatively impacted.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a semiconductor substrate, a first fin structure, a first S/D structure, and a bit line contact. The first fin structure is protruding from the semiconductor substrate, and have a first sidewall, a second sidewall, and a top surface connecting the first sidewall to the second sidewall. The first S/D structure is disposed over the first fin structure, and covering the top surface, a portion of the first sidewall, and a portion of the second sidewall of the first fin structure. The bit line contact is disposed over the first S/D structure. The bit line contact includes a barrier layer in contact with the first S/D structure and a conductive layer disposed over the barrier layer.

In another embodiment of the present disclosure, a semiconductor device structure is provided. The semiconductor device structure includes a first fin structure, a first S/D structure, a second S/D structure, a third S/D structure, a first word line, and a second word line. The first fin structure is disposed over a semiconductor substrate, and includes a first channel region, a second region, and a other region. The first S/D structure, the second S/D structure, and the third S/D structure are disposed over the first fin structure. The first word line is disposed between the first S/D structure and the second S/D structure, and across the first channel region of the first fin structure from a top view of the semiconductor device structure. The second word line is disposed between the second S/D structure and the third S/D structure, and across the second channel region of the first fin structure from the top view. A width of the first channel region is equal to a width of the second channel region, and the width of the first channel region is less than a width of the other region of the first fin structure.

In one embodiment of the present disclosure, a method for preparing a semiconductor device structure is provided. The method includes: forming a first fin structure and a second fin structure over a semiconductor substrate; forming an isolation structure over the semiconductor substrate, wherein the first fin structure and the second fin structure protrude from the isolation structure; partially removing the first fin structure and the second fin structure to form a first recessed portion of the first fin structure and a second recessed portion of the second fin structure; epitaxially growing a first S/D structure over the first recessed portion and a second S/D structure over the second recessed portion, wherein the first S/D structure is separated from the second S/D structure by a first opening; partially removing the isolation structure through the first opening to form a second opening, wherein the first opening and the second opening are a continuous space; forming a CESL over the first S/D structure and the second S/D structure such that an air gap is formed and sealed in the first opening and the second opening; forming an ILD structure over the CESL; removing a portion of the ILD structure and a portion of the CESL over the first S/D structure to form a third opening, wherein the third opening exposes the first S/D structure; performing an anisotropic deposition process to deposit a barrier layer in the third opening, wherein the barrier layer includes a bottom portion in contact with the first S/D structure and a side portion in contact with the ILD structure; and forming a conductive layer over the barrier layer, wherein the barrier layer and the conductive layer are configured to be a bit line contact.

Embodiments of a semiconductor device structure are provided in accordance with some embodiments of the disclosure. The semiconductor device structure includes a first word line across a first fin structure and a second fin structure, a first S/D structure over the first fin structure, and a second S/D structure over the second fin structure. The first S/D structure and the second S/D structure are formed adjacent to the first word line, and an air gap is formed between the first and second S/D structures. Therefore, the capacitance between adjacent S/D structures (i.e., the first and second S/D structures) may be reduced. As a result, the operation speeds of the semiconductor device structure may be increased, and the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 is a flow diagram illustrating a method of forming the semiconductor device structure, in accordance with some embodiments.

DETAILED DESCRIPTION

Figure 1:
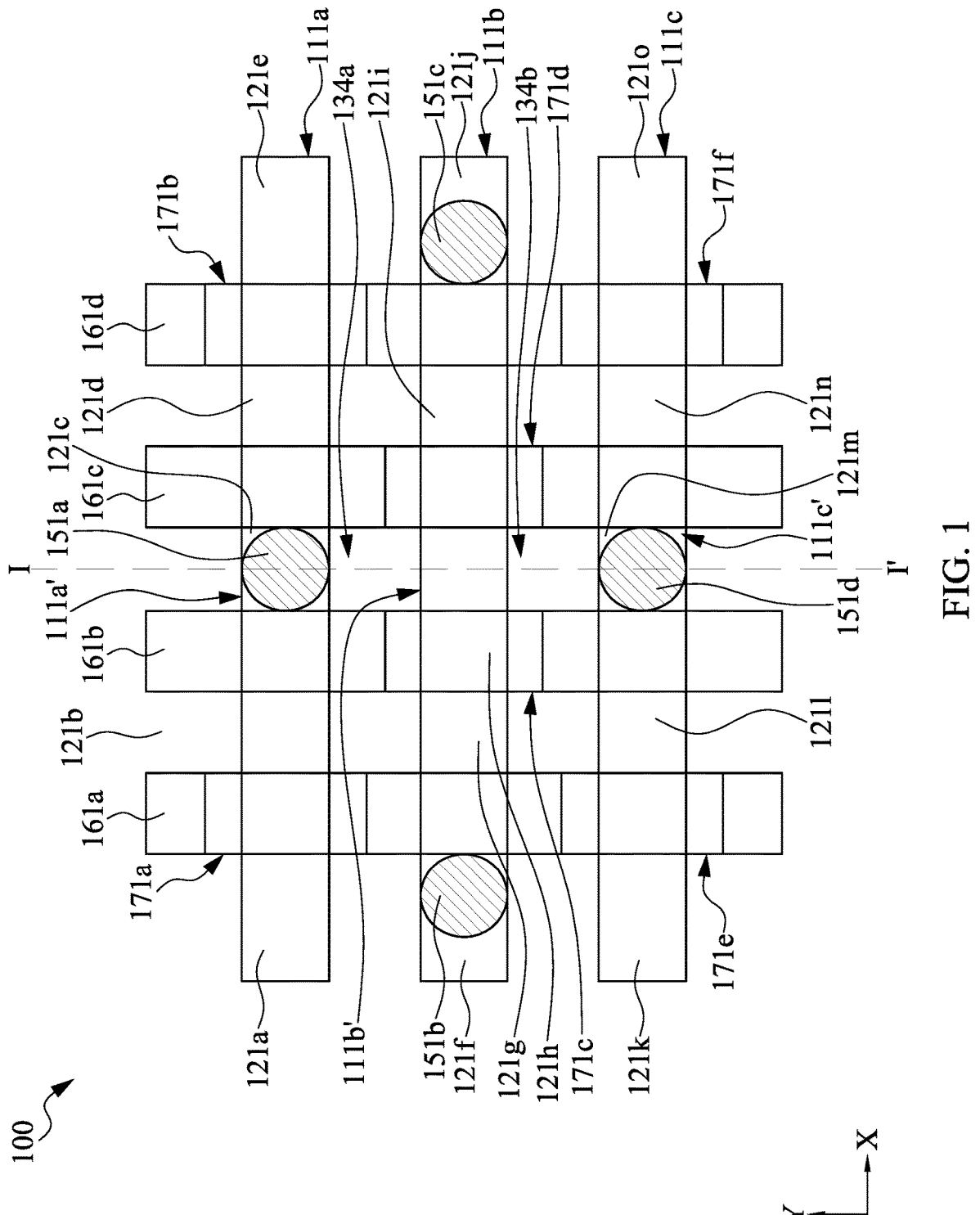
FIG. 1 is a top view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view illustrating a semiconductor device structure 100, in accordance with some embodiments. As shown in FIG. 1, the semiconductor device structure 100 includes a plurality of fin structures 111a, 111b and 111c, which are active areas of the semiconductor device structure 100, in accordance with some embodiments. The fin structures 111a, 111b and 111c are parallel to each other and extend along the X direction. It should be noted that, in the present embodiment, the semiconductor device structure 100 is a dynamic random access memory (DRAM).

Moreover, the semiconductor device structure 100 also includes a plurality of word lines 161a, 161b, 161c and 161d, as shown in FIG. 1 in accordance with some embodiments. The word lines 161a to 161d are parallel to each other and extend along the Y direction. In some embodiments, the word lines 161a are gate structures extending across the fin structures 111a to 111c.

In addition, in some embodiments, the fin structures 111a to 111c include recessed portions, which are exposed (i.e., not covered) by the word lines 161a to 161d. As shown in FIG. 1, source/drain (S/D) structures 121a, 121b, 121c, 121d and 121e are disposed over the recessed portions of the fin structure 111a, S/D structures 121f, 121g, 121h, 121i and 121j are disposed over the recessed portions of the fin structure 111b, and S/D structures 121k, 121l, 121m, 121n and 121o are disposed over the recessed portions of the fin structure 111c. It should be noted that only some of the recessed portions of the fin structures 111a, 111b and 111c are shown in FIG. 1 to simplify the diagram. For example, the S/D structure 121c is disposed over the recessed portion 111a' of the fin structure 111a, the S/D structure 121g is disposed over the recessed portion 111b' of the fin structure 111b, and the S/D structure 121m is disposed over the recessed portion 111c' of the fin structure 111c.

The semiconductor device structure 100 further includes bit line contacts 151a, 151b, 151c and 151d disposed over the S/D structures 121c, 121f, 121j and 121m, respectively, and deep trench capacitors 171a, 171b, 171c, 171d, 171e and 171f are covered by the word lines 161a to 161d. In some embodiments, each of the bit line contacts 151a, 151b, 151c and 151d has a circular contour from the top view. More specifically, the bit line contacts 151a to 151d are used to electrically connect the underlying S/D structures 121c, 121*f*, 121*j* and 121*m* to the overlying bit lines, which are not shown in FIG. 1 for the sake of simplicity and clarity.

In some embodiments, the deep trench capacitor 171*a* is located at the intersection of the word line 161*a* and the fin structure 111*a*, the deep trench capacitor 171*b* is located at the intersection of the word line 161*d* and the fin structure 111*a*, the deep trench capacitor 171*c* is located at the intersection of the word line 161*b* and the fin structure 111*b*, the deep trench capacitor 171*d* is located at the intersection of the word line 161*c* and the fin structure 111*b*, the deep trench capacitor 171*e* is located at the intersection of the word line 161*a* and the fin structure 111*c*, and the deep trench capacitor 171*f* is located at the intersection of the word line 161*d* and the fin structure 111*c*. In some embodiments, each of the deep trench capacitors 171*a* to 171*f* is embedded in one of the fin structures 111*a* to 111*c*. Moreover, the deep trench capacitors 171*a* to 171*f* may extend into a semiconductor substrate 101 (shown in FIG. 2) under the fin structures 111*a* to 111*c*.

It should be noted that, referring to the S/D structures 121*a* to 121*e* over the recessed portions of the fin structure 111*a* in FIG. 1, the S/D structures 121*a* and 121*e* are dummy S/D structures and are not electrically connected to other elements or components, the S/D structure 121*b* is electrically connected to the deep trench capacitor 171*a*, the S/D structure 121*c* is electrically connected to the overlying bit line through the bit line contact 151*a*, and the S/D structure 121*d* is electrically connected to the deep trench capacitor 171*b*, in accordance with some embodiments.

Moreover, referring to the S/D structures 121*f* to 121*j* over the recessed portions of the fin structure 111*b* in FIG. 1, the S/D structure 121*f* is electrically connected to the overlying bit line through the bit line contact 151*b*, the S/D structure 121*g* is electrically connected to the deep trench capacitor 171*c*, the S/D structure 121*h* is a dummy S/D structure and is not electrically connected to other elements or components, the S/D structure 121*i* is electrically connected to the deep trench capacitor 171*d*, and the S/D structure 121*j* is electrically connected to the overlying bit line through the bit line contact 151*c*, in accordance with some embodiments.

Furthermore, the layout of the S/D structures 121*k* to 121*o* over the recessed portions of the fin structure 111*c* is similar to the layout of the S/D structures 121*a* to 121*e*. The S/D structures 121*k* and 121*o* are dummy S/D structures and are not electrically connected to other elements or components, the S/D structure 121*l* is electrically connected to the deep trench capacitor 171*e*, the S/D structure 121*m* is electrically connected to the overlying bit line through the bit line contact 151*d*, and the S/D structure 121*n* is electrically connected to the deep trench capacitor 171*f*, as shown in FIG. 1 in accordance with some embodiments.

Figure 2:
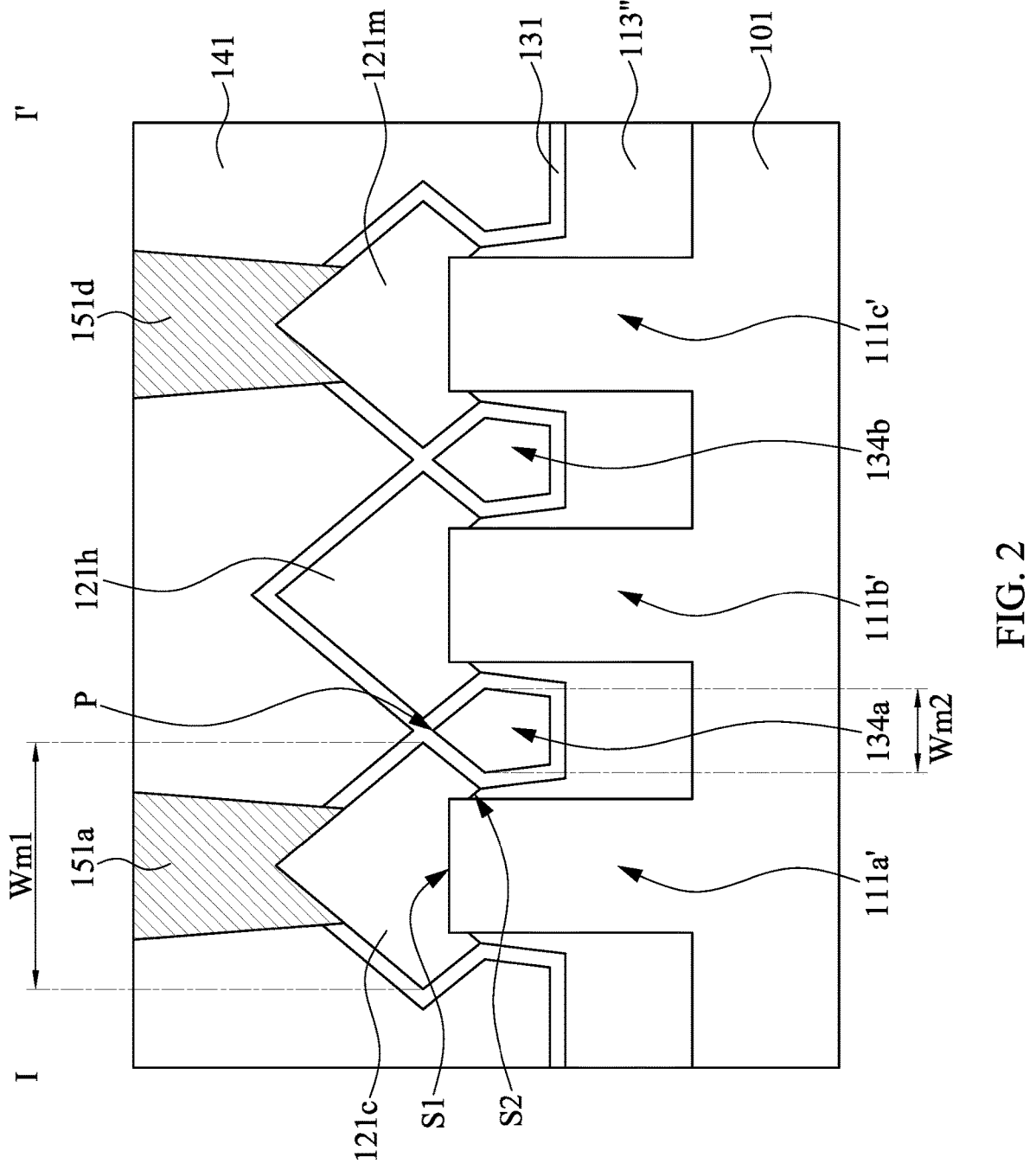
FIG. 2 is a cross-sectional view illustrating the semiconductor device structure along a sectional line I-I' in FIG. 1, in accordance with some embodiments.

FIG. 2 is a cross-sectional view illustrating the semiconductor device structure 100 along the sectional line I-I' in FIG. 1, in accordance with some embodiments. As shown in FIG. 2, an isolation structure 113" is disposed over the semiconductor substrate 101, and the recessed portions 111*a*', 111*b*' and 111*c*' of the fin structures 111*a*, 111*b* and 111*c* protrude from the isolation structure 113", in accordance with some embodiments.

In some embodiments, the S/D structures 121*c*, 121*h* and 121*m* are disposed over the recessed portions 111*a*', 111*b*' and 111*c*', a contact etch stop layer (CESL) 131 is formed covering the S/D structures 121*c*, 121*h*, 121*m* and the isolation structure 113", and a plurality of air gaps are formed between adjacent S/D structures. For example, the air gap 134*a* is formed between the S/D structures 121*c* and 121*h*, and the air gap 134*b* is formed between the S/D structures 121*h* and 121*m*, as shown in FIGS. 1 and 2 in accordance with some embodiments.

Although only three S/D structures 121*c*, 121*h*, 121*m* and three recessed portions 111*a*', 111*b*', 111*c*' of the fin structures 111*a*, 111*b*, 111*c* of the semiconductor device structure 100 are illustrated, it should be noted that, the structures and configurations of the other S/D structures and the other recessed portions of the fin structures may be similar to, or the same as, the S/D structures 121*c*, 121*h*, 121*m* and the recessed portions 111*a*', 111*b*', 111*c*'.

In some embodiments, each of the air gaps 134*a* and 134*b* is surrounded by the CESL 131 and is pentagonal in the cross-sectional view of FIG. 2, and the air gaps 134*a* and 134*b* are partially covered by the S/D structures 121*c*, 121*h* and 121*m*. More specifically, in some embodiments, the air gap 134*a* has a topmost point P, and the S/D structure 121*c* has a maximum width Wm1, wherein the portion of the S/D structure 121*c* having the maximum width Wm1 is located higher than the topmost point P of the air gap 134*a*. In some embodiments, the recessed portion 111*a*' of the fin structure 111*a* has a top surface S1, which is located higher than a portion of the air gap 134*a* having a maximum width Wm2, and an interface S2 between the isolation structure 113" and the S/D structure 121*c* is located higher than the portion of the air gap 134*a* having the maximum width Wm2. The details of the air gap 134*b* may be similar to, or the same as, those of the air gap 134*a*, and are not repeated herein.

In addition, an interlayer dielectric (ILD) structure 141 is disposed over the CESL 131, and the bit line contacts 151*a* and 151*d* are formed penetrating through the ILD structure 141 and the CESL 131 to directly contact the S/D structures 121*c* and 121*m*, respectively. Although only two air gaps 134*a* and 134*b* are shown in FIGS. 1 and 2, the semiconductor device structure 100 may include more than two air gaps. For example, the S/D structures 121*b* and 121*g* (see FIG. 1) may have an air gap therebetween. It should be noted that the air gaps may be arranged between adjacent S/D structures along the Y direction, which is parallel to the longitudinal direction of the word lines 161*a* to 161*d*.

FIG. 3 is a flow diagram illustrating a method 10 of forming the semiconductor device structure 100, and the method 10 includes steps S11, S13, S15, S17, S19 and S21, in accordance with some embodiments. The steps S11 to S21 of FIG. 3 are elaborated in connection with FIGS. 4 to 10.

Figure 4:
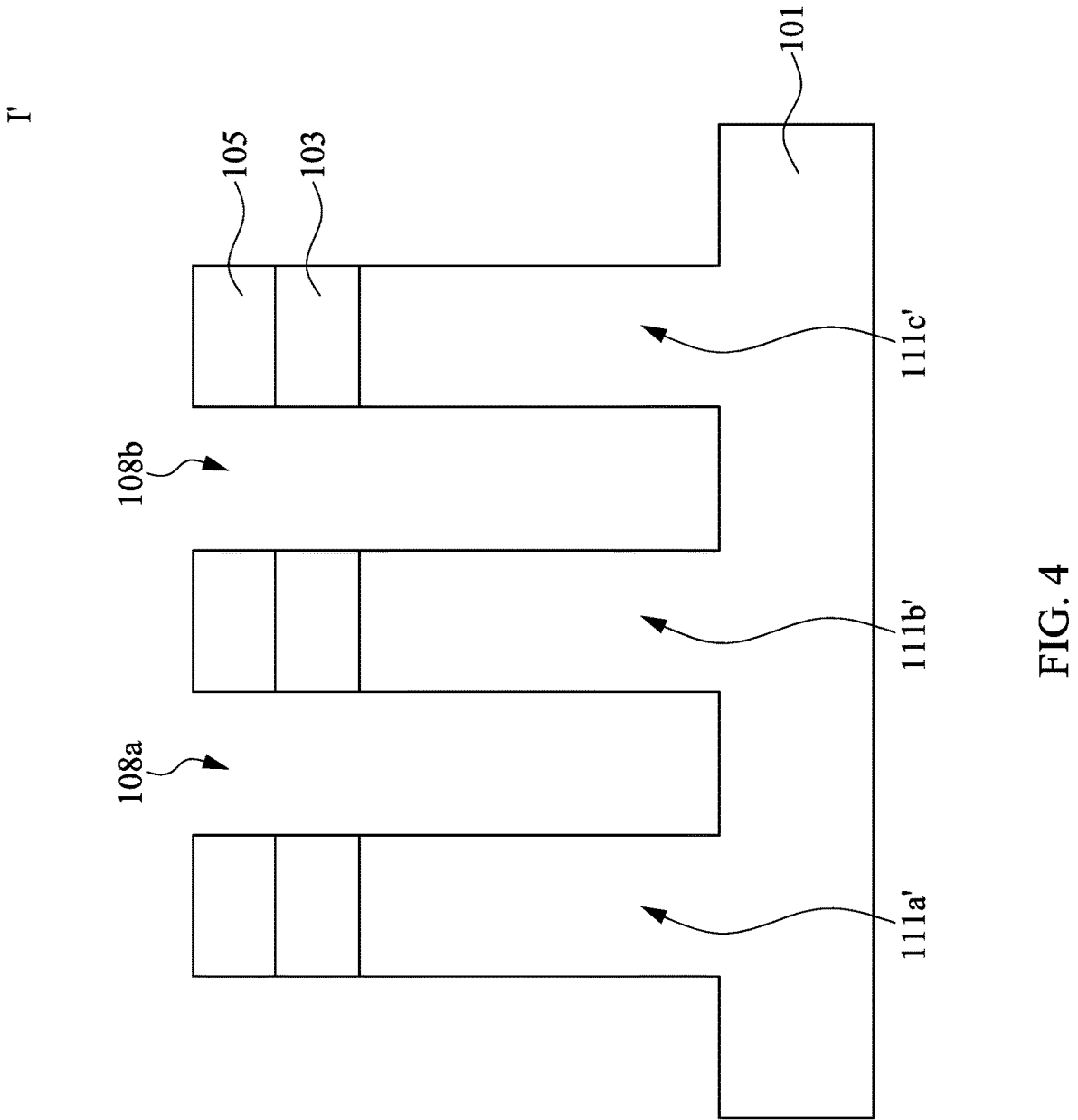
FIG. 4 is a cross-sectional view illustrating an intermediate stage in the formation of the semiconductor device structure along the sectional line I-I' in FIG. 1, in accordance with some embodiments.

FIG. 4 is a cross-sectional view illustrating an intermediate stage in the formation of the semiconductor device structure 100 along the sectional line I-I' in FIG. 1, in accordance with some embodiments.

As shown in FIG. 4, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semi-conductor. In some embodiments, the semiconductor substrate 101 is a semiconductor-on-insulator substrate, which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, a dielectric layer (not shown) is disposed over the semiconductor substrate 101, a mask layer (not shown) is disposed over the dielectric layer, and a patterned photoresist layer (not shown) is disposed over the mask layer. The patterned photoresist layer may be formed by a deposition process and a patterning process.

The deposition process for forming the patterned photoresist layer may include a chemical vapor deposition (CVD) process, a high-density plasma chemical vapor deposition (HDPCVD) process, a spin-coating process, a sputtering process, or another applicable process. The patterning process for forming the patterned photoresist layer may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process.

Moreover, the dielectric layer may be a buffer layer between the semiconductor substrate 101 and the mask layer. In some embodiments, the dielectric layer is used as a stop layer when the mask layer is removed. The dielectric layer may be made of silicon oxide. The mask layer may be made of silicon oxide, silicon nitride, silicon oxynitride, or another applicable material. The dielectric layer and the mask layer may be formed by deposition processes, which may include a CVD process, an HDPCVD process, a spin-coating process, a sputtering process, or another applicable process.

After the patterned photoresist layer is formed, the dielectric layer and the mask layer are patterned using the patterned photoresist layer as a mask, as shown in FIG. 4 in accordance with some embodiments. As a result, a patterned dielectric layer 103 and a patterned mask layer 105 are obtained. Next, the patterned photoresist layer is removed.

Next, an etching process is performed on the semiconductor substrate 101 to form the fin structures 111a, 111b and 111c using the patterned dielectric layer 103 and the patterned mask layer 105 as a mask. The respective step is illustrated as the step S11 in the method 10 shown in FIG. 3. The etching process may be a dry etching process or a wet etching process. After the etching process for forming the fin structures 111a to 111c, the fin structures 111a to 111c are separated by openings 108a and 108b.

In some embodiments, the semiconductor substrate 101 is etched by a dry etching process. The dry etching process includes using a fluorine-based etchant gas, such as $SF_6$, $C_xF_y$, $NF_3$ or a combination thereof. The etching process may be a time-controlled process, and may continue until the fin structures 111a to 111c reach a predetermined height. In some embodiments, each of the fin structures 111a to 111c has a width that gradually increases from the top portion to the bottom portion.

Figure 5:
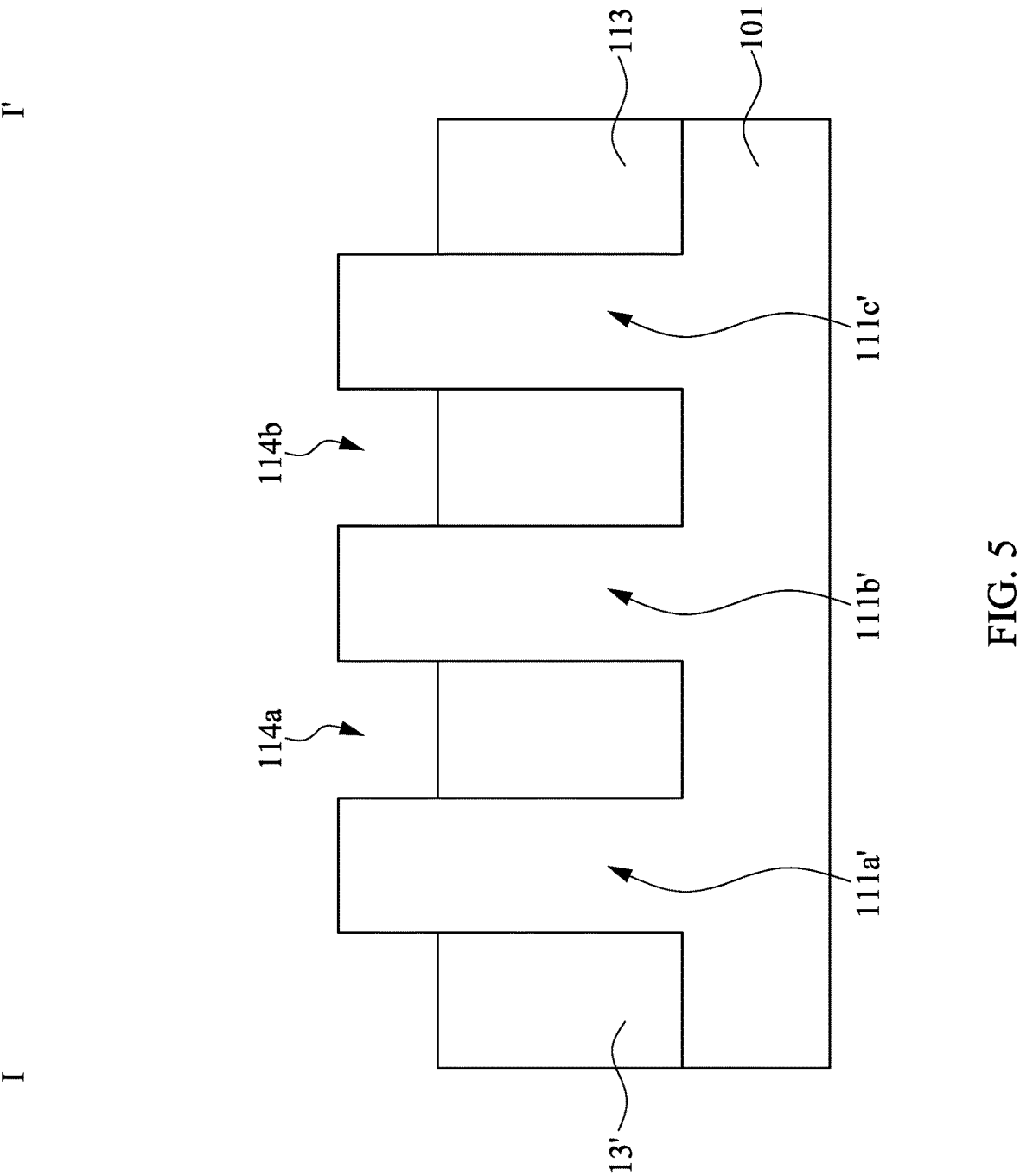
FIG. 5 is a cross-sectional view illustrating an intermediate stage in the formation of the semiconductor device structure along the sectional line I-I' in FIG. 1, in accordance with some embodiments.

FIG. 5 is a cross-sectional view illustrating an intermediate stage in the formation of the semiconductor device structure along the sectional line I-I' in FIG. 1, in accordance with some embodiments.

After the fin structures 111a to 111c are formed, an insulating material (not shown) is formed to cover the fin structures 111a to 111c, the patterned dielectric layer 103, and the patterned mask layer 105 over the semiconductor substrate 101, in accordance with some embodiments. In other words, the openings 108a and 108b are filled by the insulating material, in accordance with some embodiments. In some embodiments, the insulating material is made of silicon oxide, silicon nitride, silicon oxynitride, fluoride-doped silicate glass (FSG), or another low-k dielectric material. The insulating material may be deposited by a CVD process, a spin-on-glass process, or another applicable process.

Next, the insulating material is thinned or planarized to expose the top surface of the patterned mask layer 105. In some embodiments, the insulating material is thinned by a chemical mechanical polishing (CMP) process. Next, the patterned dielectric layer 103 and the patterned mask layer 105 are removed.

After the patterned dielectric layer 103 and the patterned mask layer 105 are removed, an upper portion of the insulating material is removed to form an isolation structure 113, as shown in FIG. 5 in accordance with some embodiments. The respective step is illustrated as the step S13 in the method 10 shown in FIG. 3. The isolation structure 113 may be a shallow trench isolation (STI) structure surrounding the fin structures 111a to 111c. In some embodiments, lower portions of the openings 108a and 108b are filled by the isolation structure 113, and openings 114a and 114b are disposed over the isolation structure 113 and between adjacent fin structures 111a, 111b and 111c.

In some embodiments, portions of the fin structures 111a to 111c are embedded in the isolation structure 113. More specifically, the lower portions of the fin structures 111a to 111c are surrounded by the isolation structure 113 while the upper portions of the fin structures 111a to 111c protrude from the isolation structure 113. The isolation structure 113 is configured to prevent electrical interference or crosstalk.

Figure 6:
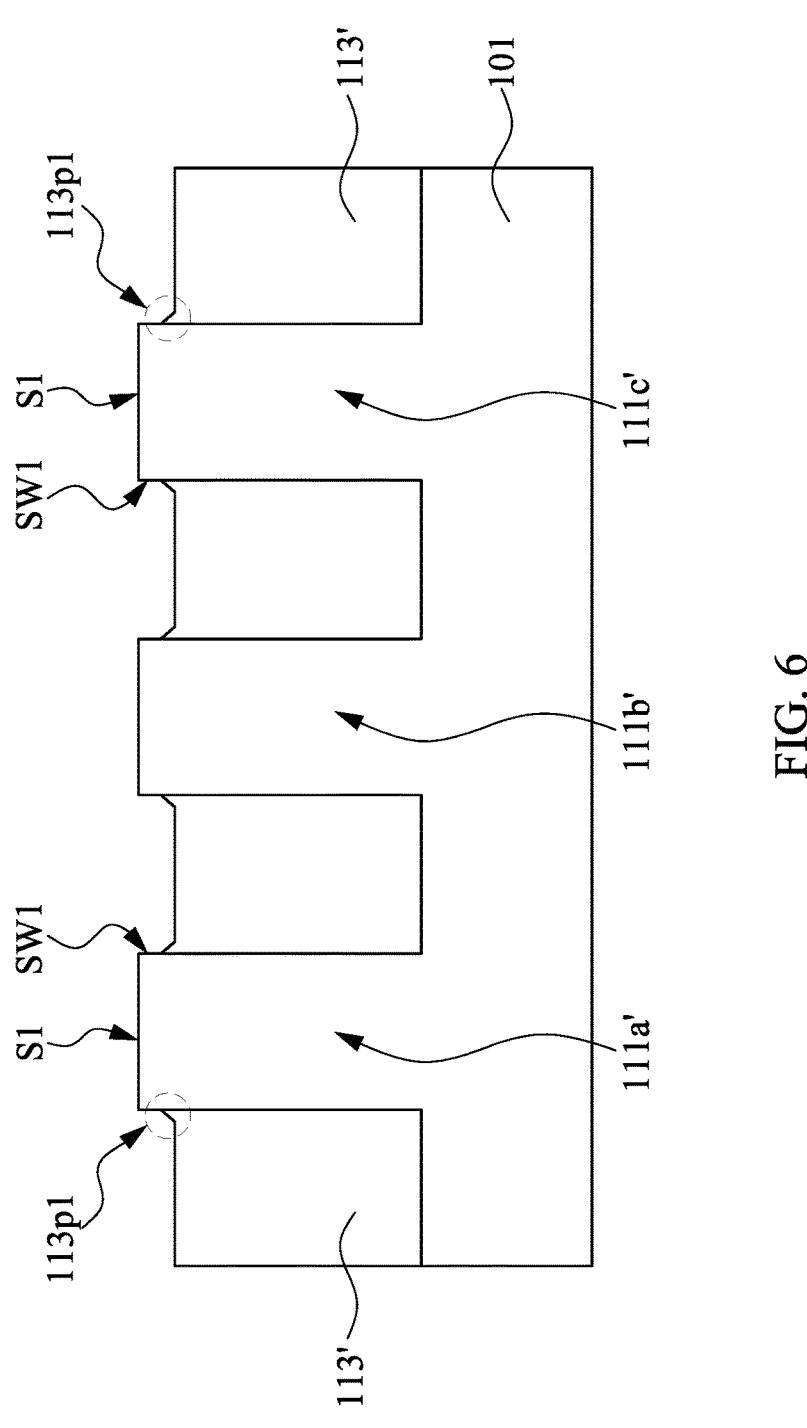
FIG. 6 is a cross-sectional view illustrating an intermediate stage in the formation of the semiconductor device structure along the sectional line I-I' in FIG. 1, in accordance with some embodiments.

FIG. 6 is a cross-sectional view illustrating an intermediate stage in the formation of the semiconductor device structure 100 along the sectional line I-I' in FIG. 1, in accordance with some embodiments.

After the isolation structure 113 is formed, the word lines 161a to 161d (see FIG. 1) are disposed across the fin structures 111a to 111c and extend over the isolation structure 113, and portions of the fin structures 111a to 111c exposed (i.e., not covered) by the word lines 161a to 161d are partially removed to form recessed portions of the fin structures, such as the recessed portion 111a' of the fin structure 111a, the recessed portion 111b' of the fin structure 111b and the recessed portion 111c' of the fin structure 111c as shown in FIG. 6 in accordance with some embodiments. The respective step is illustrated as the step S15 in the method 10 shown in FIG. 3.

In some embodiments, the word lines 161a to 161d are gate structures disposed across the fin structures 111a to 111c, and the word lines 161a to 161d are formed as dummy gate structures during this step, which will be replaced with gate structures (i.e., metal gate structures) after the CESL 131 and the ILD structure 141 are formed in subsequent processes.

More specifically, portions of the fin structures 111a, 111b and 111c adjacent to the word lines 161a to 161d are recessed to form recessed portions (e.g., the recessed portions 111a', 111b' and 111c') at two sides of the fin structures 111a, 111b and 111c. In some embodiments, the upper portions of the isolation structure 113 are removed during the recessing of the fin structures 111a, 111b and 111c, such that the recessed portions 111a', 111b' and 111c' protrude from a recessed isolation structure 113'.

In some embodiments, the recessed isolation structures 113' have protruding portions 113p1 adjacent to the recessed portions 111a', 111b' and 111c' of the fin structures 111a, 111b and 111c, and the protruding portions 113p1 have concave surfaces. In some embodiments, the recessed portions 111a', 111b' and 111c' have top surfaces S1 and sidewalls SW1 exposed (i.e., not covered) by the recessed isolation structure 113'.

Figure 7:
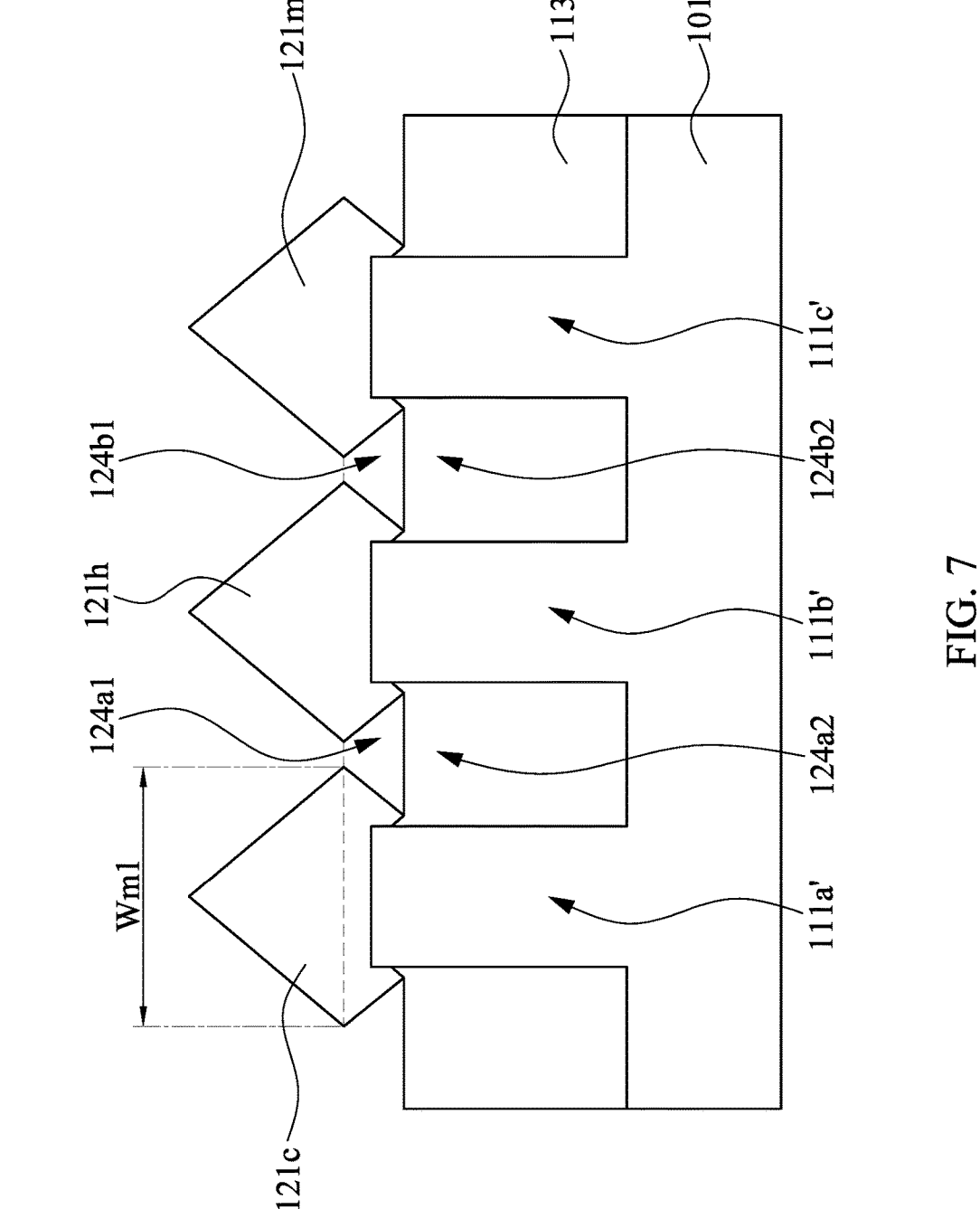
FIG. 7 is a cross-sectional view illustrating an intermediate stage in the formation of the semiconductor device structure along the sectional line I-I' in FIG. 1, in accordance with some embodiments.

FIG. 7 is a cross-sectional view illustrating an intermediate stage in the formation of the semiconductor device structure 100 along the sectional line I-I' in FIG. 1, in accordance with some embodiments.

Next, the S/D structures 121a to 121o are epitaxially grown over the recessed portions of the fin structures 111a, 111b and 111c. For example, the S/D structures 121c, 121h and 121m are disposed over the recessed portions 111a', 111b' and 111c' of the fin structures 111a to 111c, as shown in FIG. 7 in accordance with some embodiments. The respective step is illustrated as the step S17 in the method 10 shown in FIG. 3. It should be noted that, in some embodiments, the S/D structures 121a to 121o are separated from each other. That is, the S/D structures 121a to 121o are not connected to each other, or not merged together.

More specifically, the S/D structure 121c is separated from the S/D structure 121h by a first opening 124al, and the S/D structure 121h is separated from the S/D structure 121m by another first opening 124b1, as shown in FIG. 7 in accordance with some embodiments. In some embodiments, the top boundaries of the first openings 124a1 and 124b1 are defined as aligned with the locations of the maximum width of the adjacent S/D structures, such as the maximum with Wm1 of the S/D structures 121c, and a width of each of the first openings 124a1 and 124b1 increases from the top portions to the bottom portions. Furthermore, a dash line extended from the top boundaries of the first openings 124a1 and 124b2 also divides the S/D structure 121c into a top portion and a lower portion. The lower portion of the S/D structure 121c covers the top surface S1 and a portions of the sidewalls SW1. The top portion of the S/D structure 121c has a triangle contour having a primary side, i.e., the dash line shown in FIG. 7, and two subsidiary sides. The primary side is coupled to the lower portion of the S/D structure 121c, and the subsidiary sides have identical length.

In some embodiments, a strained material is grown over the recessed portions of the fin structures 111a, 111b and 111c by an epitaxial (epi) process to form the S/D structures 121a to 121o. In addition, the lattice constant of the strained material may be different from the lattice constant of the semiconductor substrate 101. In some embodiments, the materials of the S/D structures 121a to 121o include Ge, SiGe, InAs, InGaAs, InSb, GaAs, GaSb, InAlP, InP, or the like.

Figure 8:
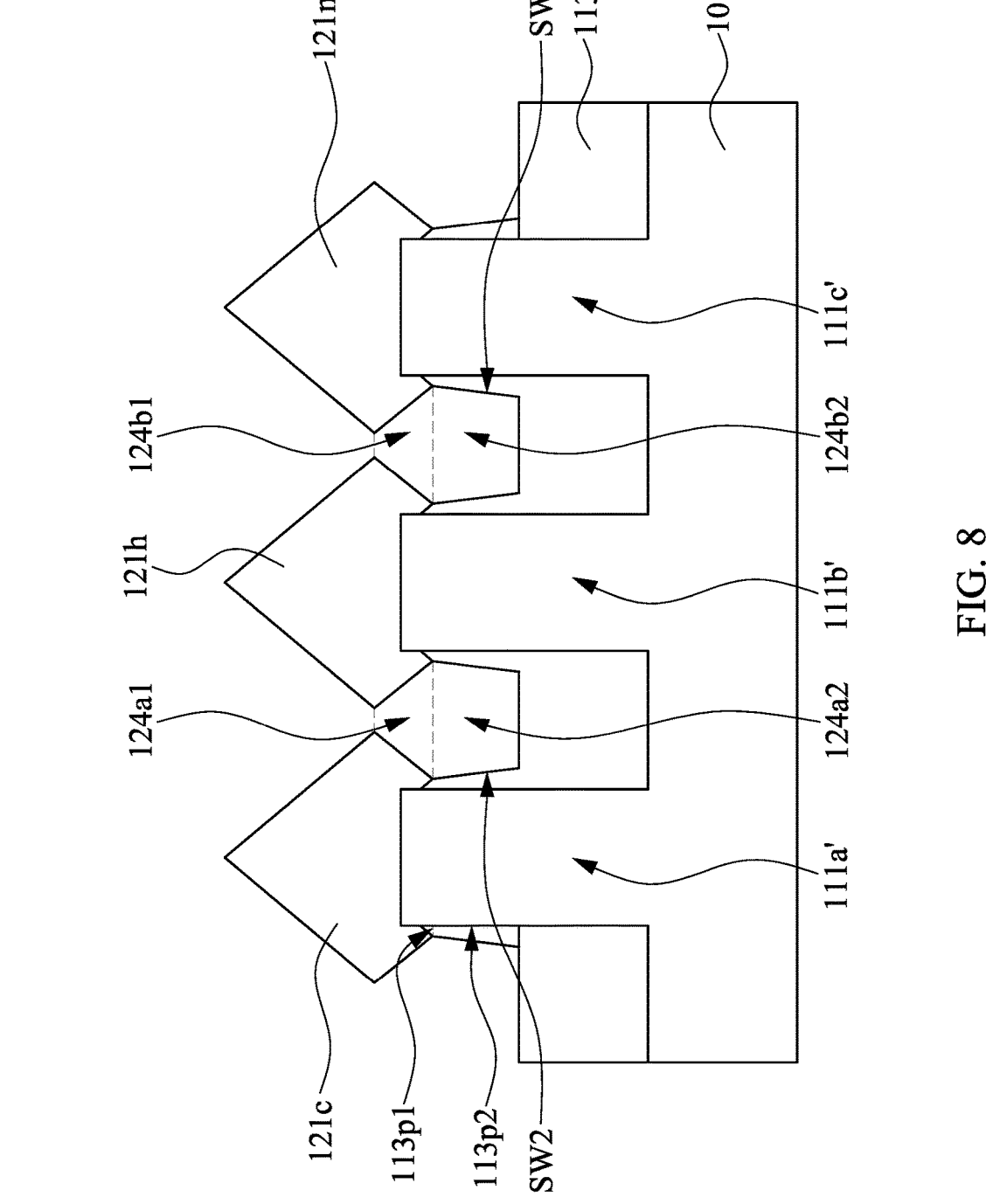
FIG. 8 is a cross-sectional view illustrating an intermediate stage in the formation of the semiconductor device structure along the sectional line I-I' in FIG. 1, in accordance with some embodiments.

FIG. 8 is a cross-sectional view illustrating an intermediate stage in the formation of the semiconductor device structure 100 along the sectional line I-I' in FIG. 1, in accordance with some embodiments.

After the S/D structures 121a to 121o are epitaxially grown, the upper portions of the recessed isolation structure 113' are removed to form an isolation structure 113", which is a remaining portion of the recessed isolation structure 113', as shown in FIG. 8 in accordance with some embodiments. More specifically, the recessed isolation structure 113' is partially removed through the first openings 124a1 and 124b1 to form second openings 124a2 and 124b2 in the isolation structure 113". The respective step is illustrated as the step S19 in the method 10 shown in FIG. 3.

In some embodiments, the partial removal of the recessed isolation structure 113' includes a wet etching process, a dry etching process, or a combination thereof. After the etching process, the second openings 124a2 and 124b2 are formed under the first openings 124a1 and 124b1, and between protruding portions 113p2 of the isolation structure 113", wherein the protruding portions 113p2 are located under the protruding portions 113p1. In some embodiments, a width of each of the second openings 124a2 and 124b2 decreases from the top portions to the bottom portions. Moreover, the protruding portions 113p2 of the isolation structure 113" have sidewalls SW2 exposed by the second openings 124a2 and 124b2.

Figure 9:
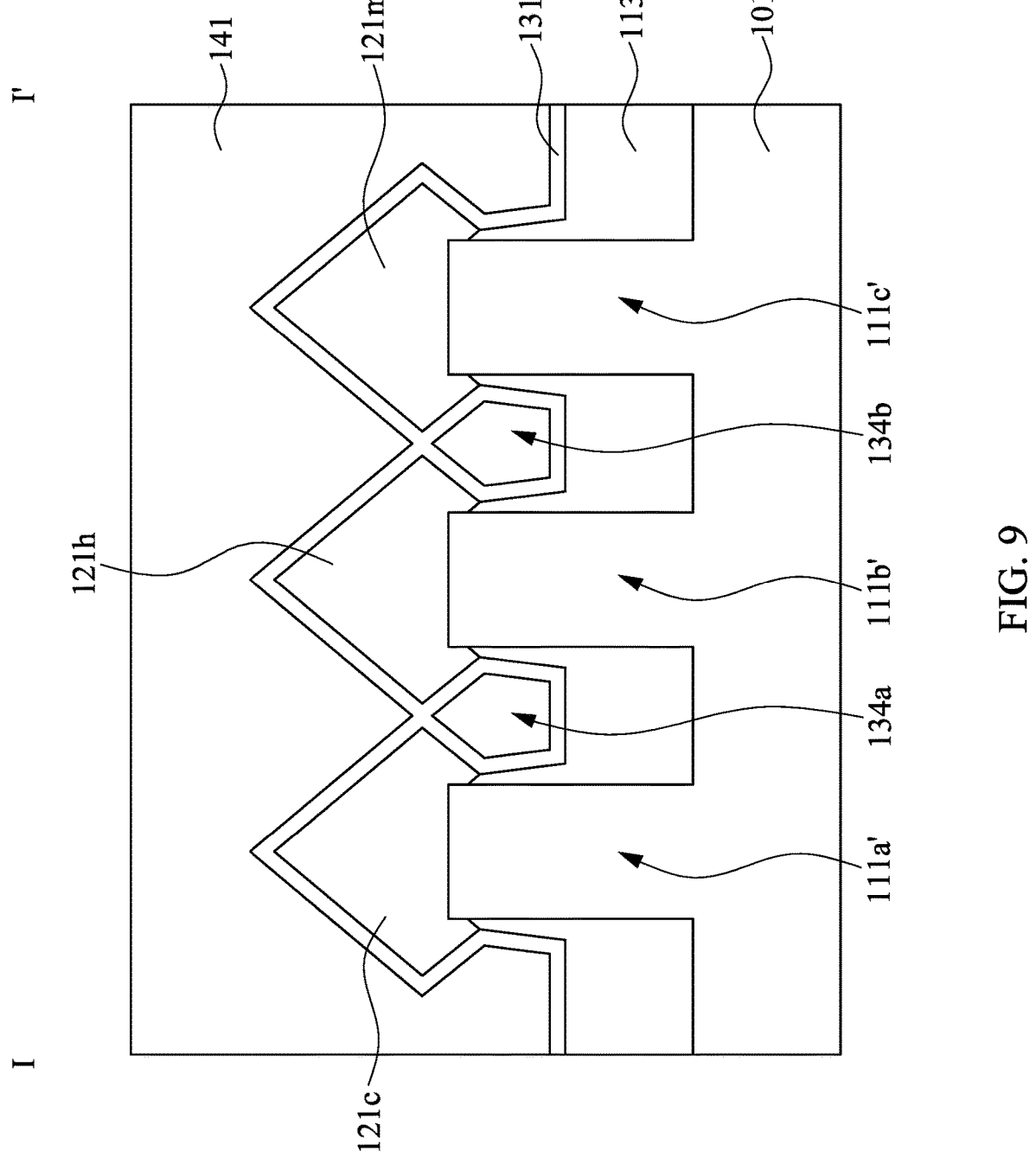
FIG. 9 is a cross-sectional view illustrating an intermediate stage in the formation of the semiconductor device structure along the sectional line I-I' in FIG. 1, in accordance with some embodiments.

FIG. 9 is a cross-sectional view illustrating an intermediate stage in the formation of the semiconductor device structure 100 along the sectional line I-I' in FIG. 1, in accordance with some embodiments.

Next, the CESL 131 is disposed over the S/D structures 121a to 121o such that air gaps are formed and sealed in the first and second openings. For example, the air gaps 134a and 134b are formed as shown in FIG. 9 in accordance with some embodiments. The respective step is illustrated as the step S21 in the method 10 shown in FIG. 3.

In some embodiments, the CESL 131 is formed covering the sidewalls SW2 of the isolation structure 113", wherein the sidewalls SW2 are exposed by the second openings 124a2 and 124b2, and the CESL 131 also covers the sidewalls of the S/D structures 121a to 121o. As a result, the air gaps 134a and 134b are surrounded by the CESL 131 in the cross-sectional view of FIG. 9. In some embodiments, the CESL 131 is made of silicon nitride, silicon oxynitride, and/or other applicable materials. Moreover, the CESL 131 is formed by plasma-enhanced CVD, low-pressure CVD, atomic layer deposition (ALD), or other applicable processes, in accordance with some embodiments.

In some embodiments, each of the air gaps 134a and 134b has a topmost point P, a leftmost point, and a rightmost point. The topmost point P is lower than the upper portion of the S/D structure 121C and higher than the top surface S1 of the fin structure 111a. The leftmost point is leveled with the rightmost point. In addition, the leftmost point and the rightmost point are lower than the top surface S1 and a topmost point of the protruding portions 113p1 of the isolation structure 113".

After the CESL 131 is formed, the ILD structure 141 is disposed over the CESL 131. It should be noted that, in the present embodiments, since the air gaps 134a and 134b are sealed by the CESL 131, the ILD structure 141 is not deposited into the air gaps 134a and 134b. In some embodiments, the ILD structure 141 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzo-cyclobutenes (BCB) and polyimide. In addition, the ILD structure 141 may be formed by CVD, physical vapor deposition, (PVD), atomic layer deposition (ALD), spin coating, or another applicable process.

Figure 10:
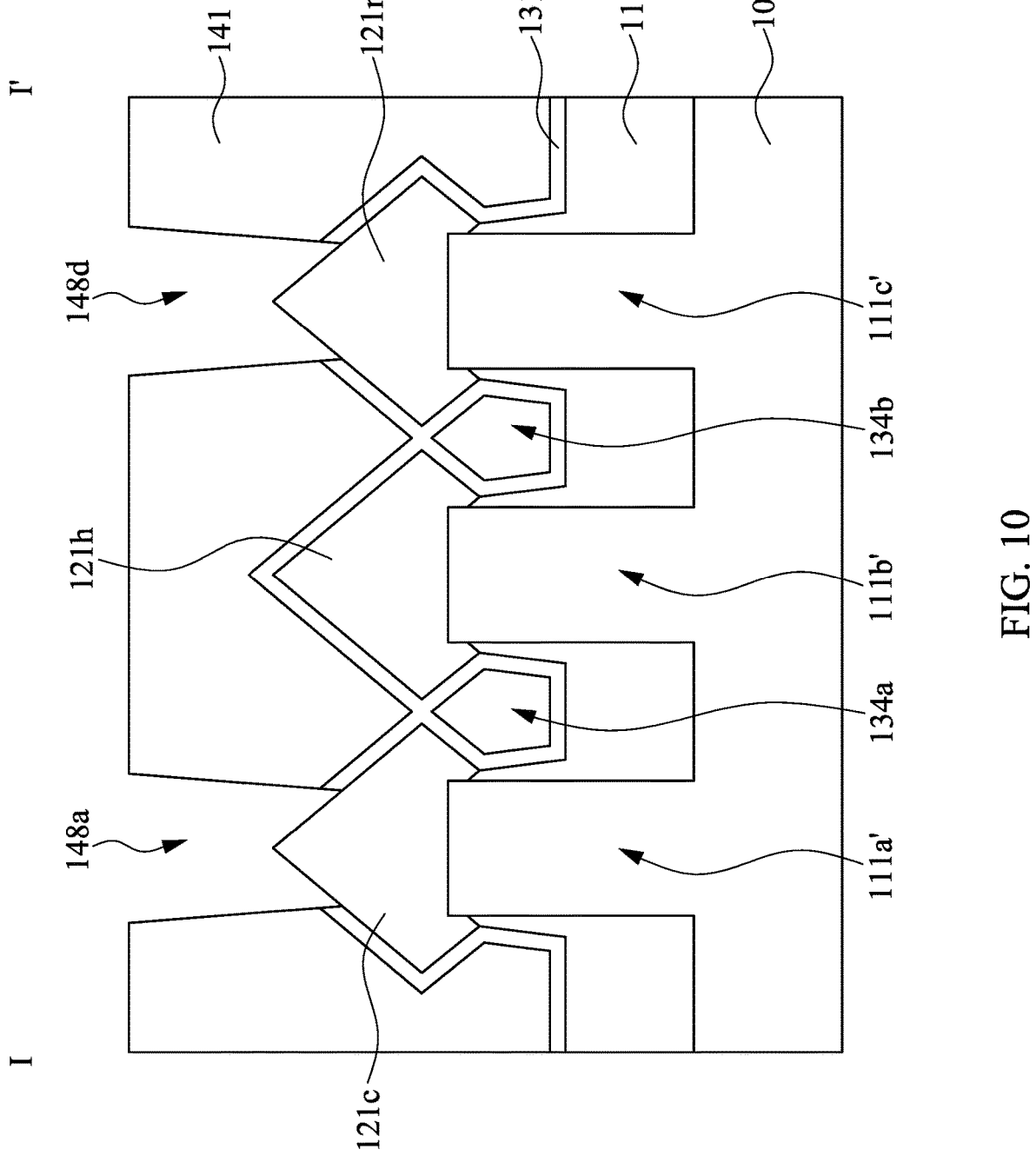
FIG. 10 is a cross-sectional view illustrating an intermediate stage in the formation of the semiconductor device structure along the sectional line I-I' in FIG. 1, in accordance with some embodiments.

FIG. 10 is a cross-sectional view illustrating an intermediate stage in the formation of the semiconductor device structure 100 along the sectional line I-I' in FIG. 1, in accordance with some embodiments.

After the ILD structure 141 is formed, the ILD structure 141 and the CESL 131 are partially removed to form a plurality of contact openings exposing the underlying S/D structures, which are designed to be electrically connected to the subsequently-formed bit lines. For example, the contact openings 148*a* and 148*d* are formed to expose the S/D structures 121*c* and 121*m*, respectively, as shown in FIG. 10 in accordance with some embodiments. Specifically, the ILD structure 141 and the CESL 131 are partially removed by an etching process, such as a dry etching process.

Next, the bit line contacts 151*a* to 151*d* are formed in the contact openings surrounded by the CESL 131 and the ILD structure 141, such as the bit line contacts 151*a* and 151*d* as shown in the cross-sectional view of FIG. 2 in accordance with some embodiments.

In some embodiments, each of the bit line contacts 151*a* to 151*d* includes multiple layers. In some embodiments, the materials of the bit line contacts 151*a* to 151*d* include poly-crystalline silicon, tungsten (W), aluminum (Al), copper (Cu), nickel (Ni), cobalt (Co), cobalt silicide, titanium silicide, tantalum silicide, nickel silicide, copper silicide, tungsten silicide, molybdenum silicide, another applicable conductive material or a combination thereof.

In addition, in some embodiments, the deep trench capacitors 171*a* to 171*f* are formed after the fin structures 111*a* to 111*c* are formed. In some embodiments, the deep trench capacitors 171*a* to 171*f* are formed before the formation of the dummy gate structures, which are used to form the word lines 161*a* to 161*d*. In some embodiments, the semiconductor device structure 100 is a DRAM, and the bit line contacts 151*a* to 151*d* are used to form vertical electrical connections between the underlying S/D structures and the overlying bit lines.

Embodiments of semiconductor device structures and method for preparing the same are provided. The semiconductor device structure 100 includes the word lines 161*a* to 161*d* disposed across the fin structures 111*a* to 111*c*, the S/D structures 121*a* to 121*o* disposed over the recessed portions (e.g., the recessed portions 111*a*', 111*b*' and 111*c*') of the fin structures 111*a* to 111*c* and adjacent to the word lines 161*a* to 161*d*, and the air gaps (e.g., air gaps 134*a* and 134*b*) formed between the adjacent S/D structures (e.g., S/D structures 121*c*, 121*h* and 121*m*) along the direction parallel to the longitudinal direction of the word lines 161*a* to 161*d*. Since the air gaps are formed between the adjacent S/D structures and the air gaps extend into adjacent recessed portions of the fin structures 111*a* to 111*c*, the capacitance between the adjacent S/D structures may be reduced. As a result, the operation speeds of the semiconductor device structure 100 may be increased, and the overall device performance may be improved.

The semiconductor device structure 100 described above is provided for illustrative purposes, and the present is no limited thereto. For example, in other embodiments, the bit line contacts 151*a* to 151*d* of the semiconductor device structure 100 can be replaced by other structure, such as a semiconductor device structure 200 shown in FIG. 12.

Figure 11:
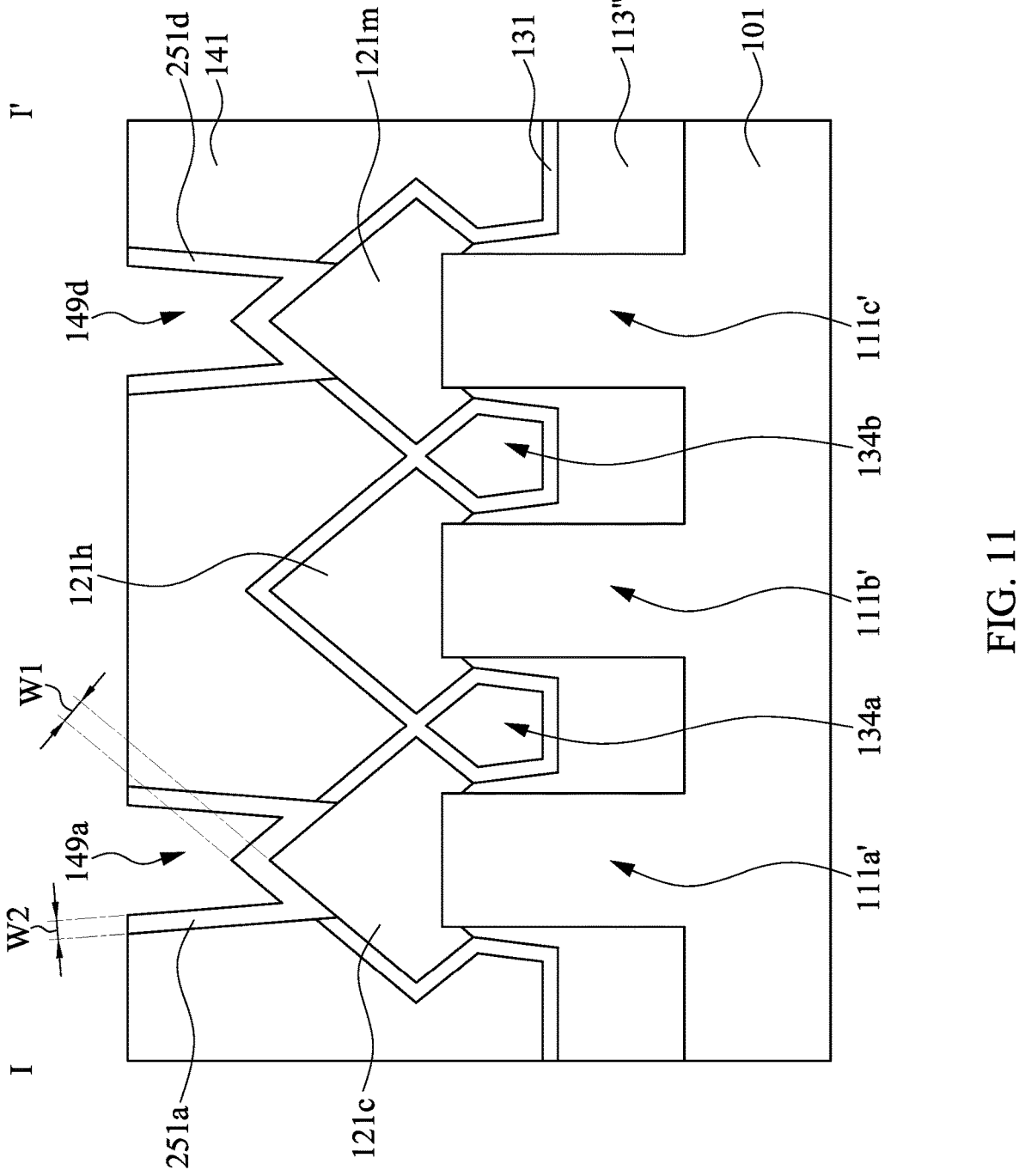
FIG. 11 is a cross-sectional view illustrating an intermediate stage in the formation of the semiconductor device structure along the sectional line I-I' in FIG. 1, in accordance with other embodiments.
Figure 12:
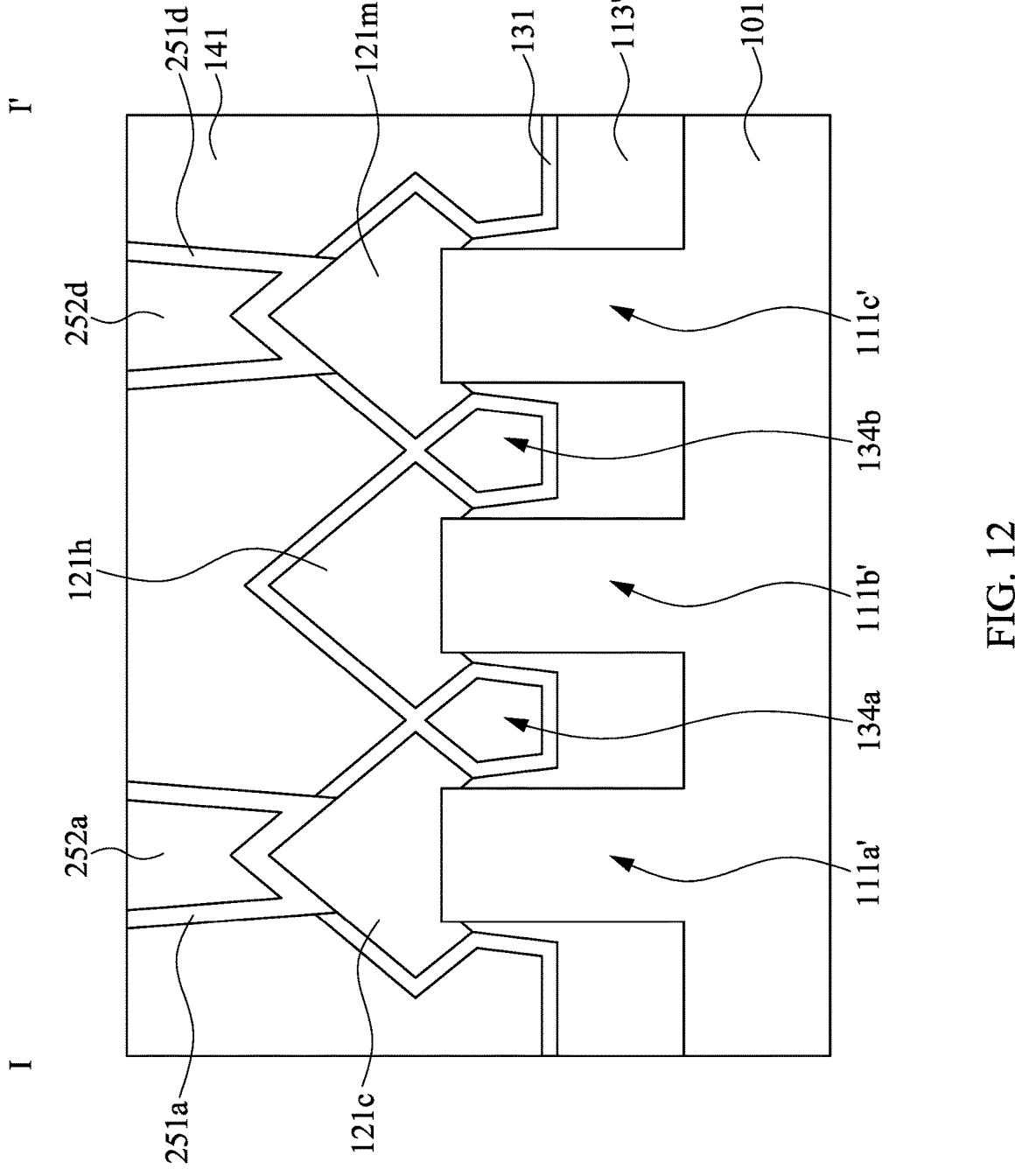
FIG. 12 is a cross-sectional view illustrating a device structure, in accordance with other embodiments.

Reference is made to FIG. 11 and FIG. 12. FIG. 11 is a cross-sectional view illustrating an intermediate stage in the formation of the semiconductor device structure 200 in accordance with other embodiments of the present disclosure. FIG. 12 is a cross-sectional view illustrating the semiconductor device structure 200 in accordance with other embodiments of the present disclosure.

In some embodiments, the formations shown in FIG. 4 to FIG. 10 can be applied to form the semiconductor device structure 200 before the bit line contacts are formed. Therefore, the details of the formations before the bit line contacts of the semiconductor device structure 200 are omitted for brevity.

In FIG. 11, a barrier layer 251*a* and a barrier layer 251*d* are formed in the contact opening 148*a* and the contact opening 148*d*, respectively. Although only the barrier layer 251*a* and the barrier layer 251*d* are described, it should be noted that a barrier layers 251*b* and a barrier layer 251*c* are also formed in the contact opening 148*b* and the contact opening 148*c*, respectively.

The barrier layer 251*a* and the barrier layer 251*d* are identical, therefore, only the barrier layer 251 is discussed below for brevity. In some embodiments, the barrier layer 251*a* is formed to cover sidewalls of the contact opening 148*a* and the exposed surface of the S/D structures 121*c*. In other words, a portion of the contact opening 148*a* is filled by the barrier layer 251*a*, so the contact opening 148*a* is shrunk to be an opening 149*a*. Similarly, the contact opening 148*d* is shrunk to be an opening 149*d* after the barrier layer 251*d* is formed.

The barrier layer 251*a* includes a bottom portion and two side portions. The bottom portion is in contact with the S/D structures 121*c* and the CESL 131, and the side portions are in contact with the ILD structure 141. In some embodiments, a thickness W1 of the bottom portion is different from a thickness W2 of the side portion. In some embodiments, the thickness W1 is greater than the thickness W2.

In some embodiments, the barrier layer 251*a* includes titanium (Ti), titanium nitride (TiN), or a combination thereof.

In some embodiments, the barrier layer 251*a* are formed by an anisotropic deposition process so that the thickness W1 is greater than the thickness W2. In some embodiments, the anisotropic deposition process for forming the barrier layer 251*a* includes a physical vapor deposition (PVD) process.

After the barrier layers 251*a* to 251*d* are formed, conductive layers 252*a* to 252*d* are formed in the openings 149*a* to 149*d*, respectively.

As illustrated in FIG. 12, the opening 149*a* and the opening 149*d* are entirely filled by the conductive layer 252*a* and the conductive layer 252*d*, respectively. The conductive layer 252*a* is separated from the S/D structures 121*c* and the ILD structure 141, and the conductive layer 252*d* is separated from the S/D structures 121*d* and the ILD structure 141.

In some embodiments, the conductive layer 252*a* and the conductive layer 252*d* include tungsten (W).

The barrier layer 251*a* and the conductive layer 252*b* together form a bit line contact 252. In some embodiments, the bit line contact 252 is a void-free contact. In some embodiments, the void-free contact has a better conductance than a contact with void. Hence, when the semiconductor device structure 200 has void-free contacts for transmitting electrical signal, the semiconductor device structure 200 can have a better performance.

Figure 13:
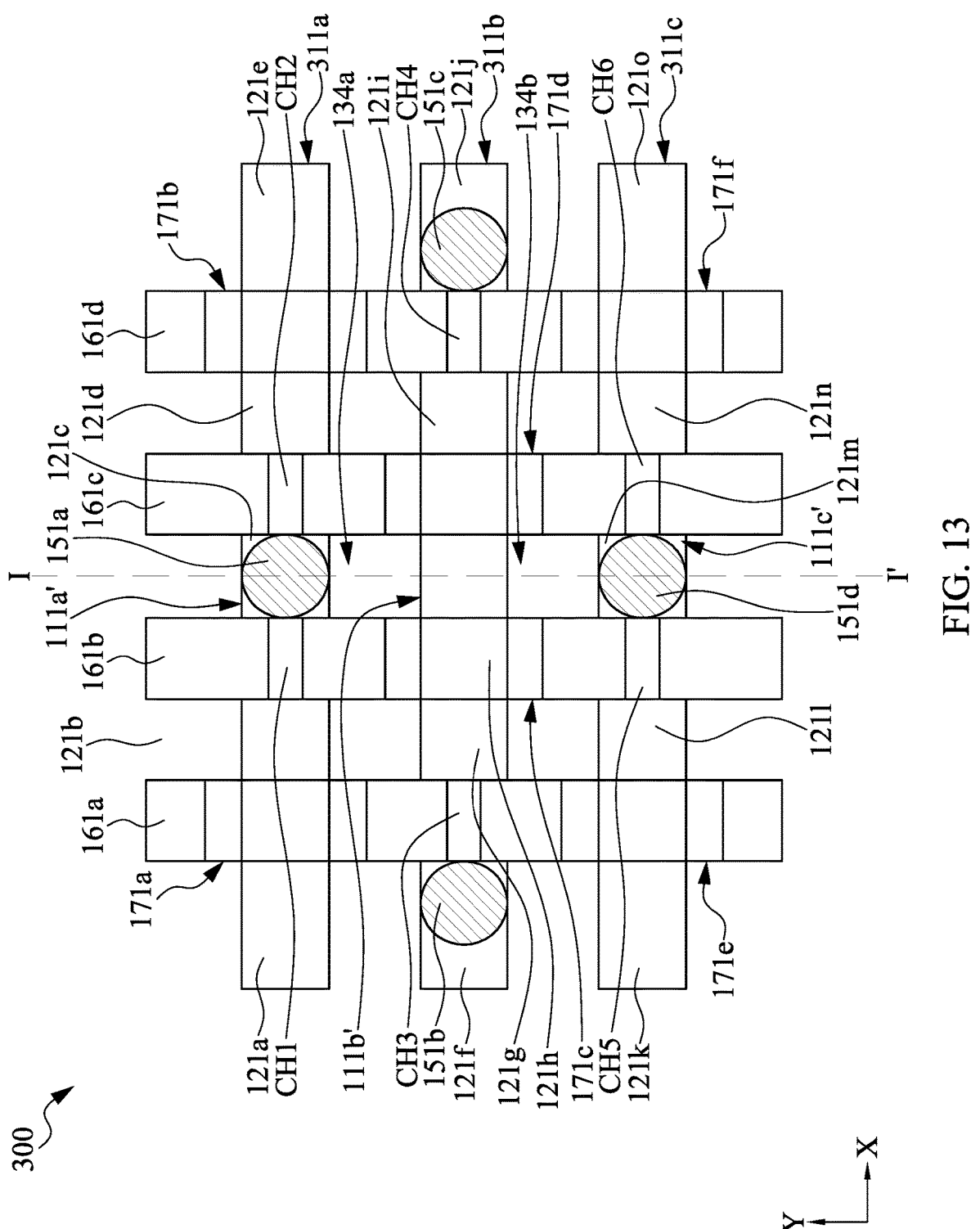
FIG. 13 is a top view illustrating a semiconductor device structure, in accordance with various embodiments.

Reference is made to FIG. 13. FIG. 13 is a top view schematic diagram of a semiconductor device structure 300 according to various embodiments of the present disclosure.

The semiconductor device structure 300 is similar to the semiconductor device structure 100 shown in FIG. 1 except the configurations of the fin structures. As illustrated in FIG.

13, the semiconductor device structure 300 includes the fin structures 311a, 311b, and 311c different from the fin structures 111a, 111b, and 111c of the semiconductor device structure 100. It should be noted that other elements of the semiconductor device structure 300 are the same as those elements of the semiconductor device structure 100.

In various embodiments, the channel regions of the fin structures 311a, 311b, and 311c have a narrower width than other regions of the fin structures 311a, 311b, and 311c.

More specifically, from the top view of the semiconductor device structure 300, the channel region CH1 and the channel region CH2 of the fin structure 311a is narrower than other region of the fin structure 311a; the channel region CH3 and the channel region CH4 of the fin structure 311b is narrower than other region of the fin structure 311b; and the channel region CH5 and the channel region CH6 of the fin structure 311c is narrower than other region of the fin structure 311c.

Although the semiconductor device structures 200 and 300 described above have respective and distinct features, the semiconductor device structure 200 may include the features of the semiconductor device structure 300, and the semiconductor device structure 300 may include the features of the semiconductor device structure 200.

In one embodiment of the present disclosure, a semiconductor device structure is provided. The semiconductor device structure includes a semiconductor substrate, a first fin structure, a first S/D structure, and a bit line contact. The first fin structure is protruding from the semiconductor substrate, and have a first sidewall, a second sidewall, and a top surface connecting the first sidewall to the second sidewall. The first S/D structure is disposed over the first fin structure, and covering the top surface, a portion of the first sidewall, and a portion of the second sidewall of the first fin structure. The bit line contact is disposed over the first S/D structure. The bit line contact includes a barrier layer in contact with the first S/D structure and a conductive layer disposed over the barrier layer.

In another embodiment of the present disclosure, a semiconductor device structure is provided. The semiconductor device structure includes a first fin structure, a first S/D structure, a second S/D structure, a third S/D structure, a first word line, and a second word line. The first fin structure is disposed over a semiconductor substrate, and includes a first channel region, a second region, and a other region. The first S/D structure, the second S/D structure, and the third S/D structure are disposed over the first fin structure. The first word line is disposed between the first S/D structure and the second S/D structure, and across the first channel region of the first fin structure from a top view of the semiconductor device structure. The second word line is disposed between the second S/D structure and the third S/D structure, and across the second channel region of the first fin structure from the top view. A width of the first channel region is equal to a width of the second channel region, and the width of the first channel region is less than a width of the other region of the first fin structure.

In one embodiment of the present disclosure, a method for preparing a semiconductor device structure is provided. The method includes: forming a first fin structure and a second fin structure over a semiconductor substrate; forming an isolation structure over the semiconductor substrate, wherein the first fin structure and the second fin structure protrude from the isolation structure; partially removing the first fin structure and the second fin structure to form a first recessed portion of the first fin structure and a second recessed portion of the second fin structure; epitaxially growing a first S/D structure over the first recessed portion and a second S/D structure over the second recessed portion, wherein the first S/D structure is separated from the second S/D structure by a first opening; partially removing the isolation structure through the first opening to form a second opening, wherein the first opening and the second opening are a continuous space; forming a CESL over the first S/D structure and the second S/D structure such that an air gap is formed and sealed in the first opening and the second opening; forming an ILD structure over the CESL; removing a portion of the ILD structure and a portion of the CESL over the first S/D structure to form a third opening, wherein the third opening exposes the first S/D structure; performing an anisotropic deposition process to deposit a barrier layer in the third opening, wherein the barrier layer includes a bottom portion in contact with the first S/D structure and a side portion in contact with the ILD structure; and forming a conductive layer over the barrier layer, wherein the barrier layer and the conductive layer are configured to be a bit line contact.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a semiconductor substrate;
   a first fin structure protruding from the semiconductor substrate, having a first sidewall, a second sidewall, and a top surface connecting the first sidewall to the second sidewall;
   a first source/drain (S/D) structure disposed over the first fin structure, covering the top surface, a portion of the first sidewall, and a portion of the second sidewall of the first fin structure; and
   a bit line contact disposed over the first S/D structure, comprising:
   a barrier layer in contact with the first S/D structure; and
   a conductive layer disposed over the barrier layer;
   wherein the barrier layer comprises:
   two side portions; and
   a bottom portion connecting one of the two side portions to another one of the two side portions,
   wherein a thickness of the bottom portion is greater than a thickness of the two side portions.

2. The semiconductor device structure of claim 1, wherein the first S/D structure comprises a lower portion and an upper portion over the lower portion, wherein the lower portion covers the top surface, the portion of the first sidewall, and the portion of the second sidewall of the first fin structure, wherein the upper portion has a triangle contour, wherein upper portion has a primary side coupled to the lower portion, and two subsidiary sides enclosing the triangle contour with the primary side, wherein the two subsidiary sides have identical length.

3. The semiconductor device structure of claim 2, wherein the barrier layer is in contact with the two subsidiary sides.

4. The semiconductor device structure of claim 2, wherein the first S/D structure has a maximum width equal to a length of the primary side.

5. The semiconductor device structure of claim 4, further comprising:

a second fin structure protruding from the semiconductor substrate, wherein the second fin structure is disposed parallel to the first fin structure; and a second S/D structure disposed over the second fin structure; and an isolation structure formed between the first fin structure and the second fin structure, wherein the isolation structure comprises protruding portions in contact with the first S/D structure and the second S/D structure.

6. The semiconductor device structure of claim 5, further comprising:

a contact etch stop layer (CESL) in contact with the two subsidiary sides of the upper portion of the first S/D structure, the lower portion of the first S/D structure, the isolation structure, the second S/D structure, and the barrier layer; and an air gap disposed between the first fin structure and the second fin structure, wherein the air gap is surrounded by the CESL and sealed by the CESL.

7. The semiconductor device structure of claim 6, wherein the air gap has a pentagonal contour.

8. The semiconductor device structure of claim 6 wherein a topmost point of the air gap is lower than the upper portion of the first S/D structure, and the topmost point of the air gap is higher than the top surface of the first fin structure.

9. The semiconductor device structure of claim 6, wherein the air gap has a leftmost point and a rightmost point leveled with the leftmost point, wherein the leftmost point and the rightmost point are lower than the top surface of the first fin structure.

10. The semiconductor device structure of claim 9, wherein a topmost point of the protruding portions of the isolation structure is higher than the leftmost point and the rightmost point of the air gap.

11. The semiconductor device structure of claim 6, further comprising:

an interlayer dielectric (ILD) structure disposed over the CESL and in contact with the barrier layer;

wherein the second S/D structure is separated from the ILD.

12. The semiconductor device structure of claim 6, further comprising:

a first word line across the first fin structure and the second fin structure from a top view of the semiconductor device structure; and a second word line across the first fin structure and the second fin structure from the top view of the semiconductor device structure, wherein the first word line is parallel to the second word line;

wherein the first S/D structure, the second S/D structure, and the air gap are disposed between the first word line and the second word line from the top view.

* * * * *